United States Patent [19]
Nakamura et al.

[11] Patent Number: 5,922,480
[45] Date of Patent: Jul. 13, 1999

[54] ORGANIC EL DEVICE

[75] Inventors: Norikazu Nakamura; Keiichi Miyairi, both of Nagano, Japan

[73] Assignee: Shinko Electric Industries, Co., Ltd., Nagano, Japan

[21] Appl. No.: 08/827,655

[22] Filed: Apr. 9, 1997

[30] Foreign Application Priority Data

Apr. 11, 1996 [JP] Japan .................................. 8-089432

[51] Int. Cl.⁶ ................................................. H05B 33/00
[52] U.S. Cl. ......................... 428/690; 428/917; 313/504; 313/505; 313/506
[58] Field of Search ..................... 428/690, 917; 313/504, 505, 506

[56] References Cited

U.S. PATENT DOCUMENTS 4,539,507  9/1985  VanSlyke et al. ...................... 313/504

FOREIGN PATENT DOCUMENTS

| 652 273 A1 | 5/1995 | European Pat. Off. . |
| 700 917 A2 | 3/1996 | European Pat. Off. . |
| 743 809 A2 | 5/1996 | European Pat. Off. . |
| 797 375 A2 | 3/1997 | European Pat. Off. . |
| 8-81472 | 3/1996 | Japan . |

OTHER PUBLICATIONS

Chemical Abstracts, vol. 123, No. 10, Sep. 4, 1995, Columbus, Ohio. Sato, Yoshiharu: "Organic Electroluminescence Device" XP–002057020 and JP 07 142 169A (Mitsubishi Kagaku KK, Japan).

Chemical Abstracts, vol. 122, No. 12, Mar. 20, 1995, Columbus, Ohio. Sato, Yoshiharu: "Organic Field–effect Electroluminescent Device Having Oxazole Metal Complex Light–emitting Layer" XP–002057021 and JP 06 336 586 A (Mitsubishi Chem Ind. Japan).

Hamada, Yuji et al., "Blue Electroluminescence in Thin Films of Azomethin–Zinc Complexes"; Japanese Journal of Applied Physics 32 (1993) Apr. 1, No. 4A, Part 2, Tokyo, JP.

Appl. Phys. Lett. 51 (12), Sep. 21, 1987, "Organic Electroluminescent Diodes", by C. Tang et al. pp. 913–915.

*Primary Examiner*—Charles Nold
*Attorney, Agent, or Firm*—Pennie & Edmonds

[57] ABSTRACT

In an organic EL device which includes an organic luminescent layer 18 composed of an organic compound and a hole transporting layer 16 between a cathode 10 and an anode 14, the organic EL device has between the cathode 10 and the organic luminescent layer 18 an electron transporting layer 20 composed of 2-(O-hydroxyphenyl)-benzoxazole or -benzothiazcle zinc complex. The organic EL device of the present invention can emit light of high intensity compared with conventional organic EL devices.

8 Claims, 3 Drawing Sheets

ORGANIC EL DEVICE

BACKGROUND OF THE INVENTION

1. Field of the Invention

The present invention relates to an organic EL device and, in more detail, it relates to an organic EL device comprising, between a cathode and an anode, a hole transporting layer and an organic luminescent layer which comprises an organic compound.

2. Description of the Related Art

As shown in FIG. 5, a conventional two layer type EL device having, between a cathode 100 and an anode 104 formed on a glass plate 102, a luminescent layer 108 composed of a luminescent material which exhibits electroluminescence when a voltage is applied thereto and a hole transporting layer 106 which transports holes generated in the anode 104 smoothly to the luminescent layer 108, has been used in a backlight for the display of an OA machine such as a word processor, for an automobile meter, and the like.

Although an inorganic compound has conventionally been used as the luminescent material for such an EL device, a high driving voltage has been required when the inorganic compound for the EL device is caused to emit high-intensity light.

Accordingly, research on organic luminescent compounds for EL devices which allow lower driving voltages has recently been conducted (see, for example, C. W. Tang and S. A. VanSlyke: Appl. Phys. Lett. 51. 913 (1987)).

An organic EL device having a luminescent layer composed of such an organic compound can be driven at a low voltage compared with an EL device having a luminescent layer composed of a conventional inorganic compound.

However, such a conventional organic El device does not emit light of a sufficient intensity when used in a backlight for a display of an OA machine, and the like.

Although Japanese Unexamined Patent Publication No. 8-81472 discloses a three layer type EL device having a luminescent layer composed of 2-(O-hydroxyphenyl)-benzoxazole or -benzothiazole zinc complex, a three layer type organic EL device having an electron transporting layer composed of such a zinc complex as mentioned above has not been known.

SUMMARY OF THE INVENTION

An object of the present invention is to provide a three layer type EL device capable of emitting light of high intensity compared with conventional organic EL devices.

As a result of intensively conducting investigation to achieve the object, the present inventors have found that a three layer type organic EL device which is provided with an electron transporting layer comprising 2-(O-hydroxyphenyl)-benzoxazole or -benzothiazole zinc complex between a cathode and an organic luminescent layer is capable of emitting light of high intensity compared with a two layer type organic EL device which is not provided with such an electron transporting layer. The present invention has thus been achieved.

In other words, the present invention provides an organic EL device which includes an organic luminescent layer comprising an organic compound and a hole transporting layer between a cathode and an anode, wherein said organic EL device comprises between said cathode and said organic luminescent layer an electron transporting layer comprising a zinc complex of the formula

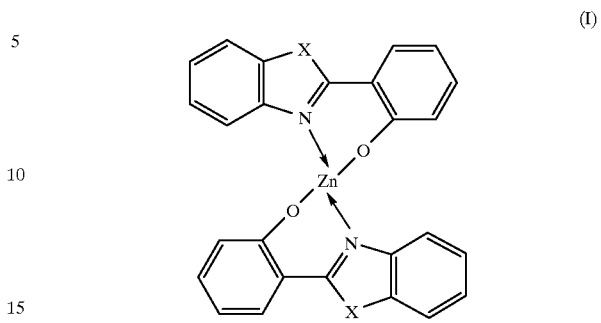

wherein X represents S or O.

DESCRIPTION OF THE PREFERRED EMBODIMENTS

An organic EL device which emits green light of high intensity is obtained in the present invention when the EL device has an organic luminescent layer comprising quinolinol aluminum complex of the formula

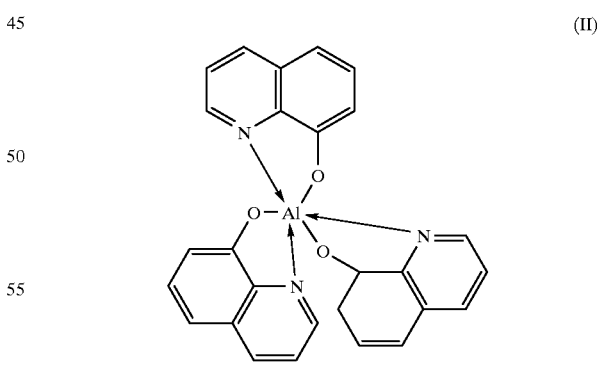

Examples of the luminescent materials used in the organic luminescent layer may include quinolinol zinc complex, phorphiline zinc complex, azomethine zinc complex, and the like in addition to the quinolinol aluminum complex mentioned above.

As a result of forming a hole transporting layer from a tetraphenyldiamine derivative of the formula

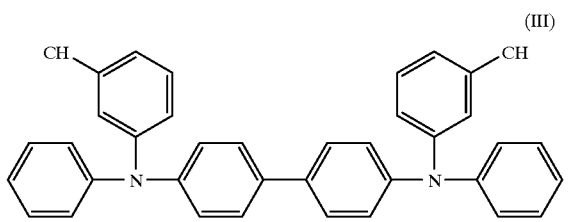

(III)

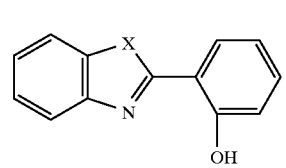

(IV)

wherein X is S or O, with zinc acetate.

The reaction may be carried out by adding a solution of zinc acetate to a solution of the compound of the formula (IV) in a solvent such as methanol, and stirring the mixture at a specified temperature for a specified period of time. The reaction product thus obtained is purified if necessary.

Figure 1:
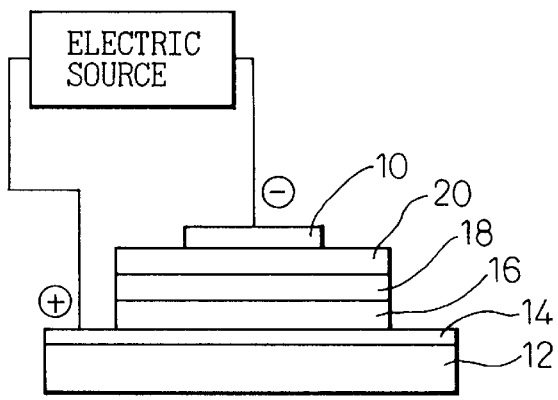
FIG. 1 is a drawing for explanation of an embodiment of an organic EL device according to the present invention.

Furthermore, the luminescent layer 18 of the three layer type organic EL device shown in FIG. 1 comprises quinolinol aluminum complex of the formula (II).

Such an organic EL device in which the luminescent layer 18 comprises quinolinol aluminum complex emits green light.

Still furthermore, the hole transporting layer 16 of the organic EL device in FIG. 1 comprises the tetraphenyldiamine derivative of the formula (III).

In addition, a polycarbonate or polyvinylcarbazole may also be used in place of the compound of the formula (III) as a compound which may comprise the hole transporting layer 16.

In FIG. 1, the hole transporting layer 16, the luminescent layer 18 and the electron transporting layer 20 are each formed by vacuum deposition on the transparent anode 14 composed of indium-tin oxide (ITO) on the transparent glass plate 12 to give the organic EL device. In such vacuum deposition, each layer is formed by continuous deposition in a high vacuum of about $10^{-6}$ Torr without interrupting the vacuum state.

In such an EL device, the luminescent material of the luminescent layer 18 is excited and emits light when a direct current or pulse voltage is applied from an electric source to the cathode 10 and the anode 14.

Such a three layer type organic EL device according to the present invention exhibits a significantly improved luminance compared with the conventional two layer type EL device including the hole transporting layer 16 and the luminescent layer 18 alone between the cathode 10 and the anode 14.

A two layer type organic EL device in which a luminescent layer composed of 2-(O-hydroxyphenyl)benzothiazole zinc complex is used has been proposed in Nikkei Microdevices, February (1996).

However, the electron transporting layer 20 composed of the 2-(O-hydroxyphenyl)benzothiazole zinc complex of the three layer type organic EL device according to the present invention emits no light even when a voltage is applied to the anode 14 and the cathode 10. It is a layer which acts to move the electrons of the cathode 10 to the luminescent layer 18 smoothly. Accordingly, the three layer type organic EL device according to the present invention is different from the two layer type organic EL device described in Nikkei Microdevices.

The present invention will be illustrated below with reference to examples.

EXAMPLE 1

(1) Synthesis of 2-(O-hydroxyphenyl)benzothiazole zinc complex

A solution at 50° C. of 484 mg (2.13 mmol) of 2-(O-hydroxyphenyl)bezothiazole in methanol was added slowly to a solution at 50° C. of 226 mg (1.03 mmol) of zinc acetate in methanol.

holes generated in the anode can be smoothly transported to the luminescent layer.

Examples of the materials used in the hole injection layer may include pirazoline dimer, polyvinylcarbazole, and the like in addition to the tetraphenyldiamine derivative mentioned above.

It is supposed that the organic EL device according to the present invention can emit light of high intensity compared with conventional two layer type organic EL devices for reasons as described below.

That is, when a cathode and an anode composed of metals and a luminescent layer composed of an organic compound are employed, both electrons generated in the cathode and holes generated in the anode are difficult to be transported to the lumirescent layer owing to a difference between the metal phase and the organic phase.

In the present invention, however, a hole transporting layer is provided between the anode and the luminescent layer in order to transport the holes generated in the anode to the luminescent layer smoothly.

Furthermore, an electron transporting layer composed of a zinc complex represented by the formula (I) is provided between the cathode and the fluorescent layer in order to transport the electrons generated in the cathode to the luminescent layer smoothly.

In the organic EL device of the present invention, therefore, the electrons generated in the cathode and the holes generated in the anode are likely to be easily transported to and injected into the luminescent layer through the electron transporting layer and the hole transporting layer, respectively, to enhance the densities of the electrons and the holes therein. As a result, the efficiency of recombining the electrons and the holes is enhanced, and the EL device may thus emit light of high intensity.

As shown in FIG. 1, the organic EL device of the present invention is a three layer type in which a hole transporting layer 16, a luminescent layer 18 and an electron transporting layer 20 are laminated in order between a cathode 10 composed of aluminum and a transparent anode 14 composed of indium-tin oxide (ITO) on a transparent glass plate 12, to the anode 14.

The cathode 10 has a thickness of 100 nm, and the hole transporting layer 16, the luminescent layer 18 and the electron transporting layer 20 each have a thickness of 75 nm.

The electron transporting layer 20 shown in FIG. 1 comprises the zinc complex of the formula (I).

The zinc complex of the formula (I) used in the present invention can be obtained by reacting a compound of the formula The resultant solution in methanol was stirred for 1 hour and 45 minutes while being held at 50° C., followed by filtering out the precipitate. The precipitate obtained by filtering was successively washed with water, a saturated solution of sodium bicarbonate and methanol, and finally washed with hexane, followed by drying in vacuum. The yield of the product was 316 mg (59%), and its melting point was 304° C. (DSC measurement).

Figure 2:
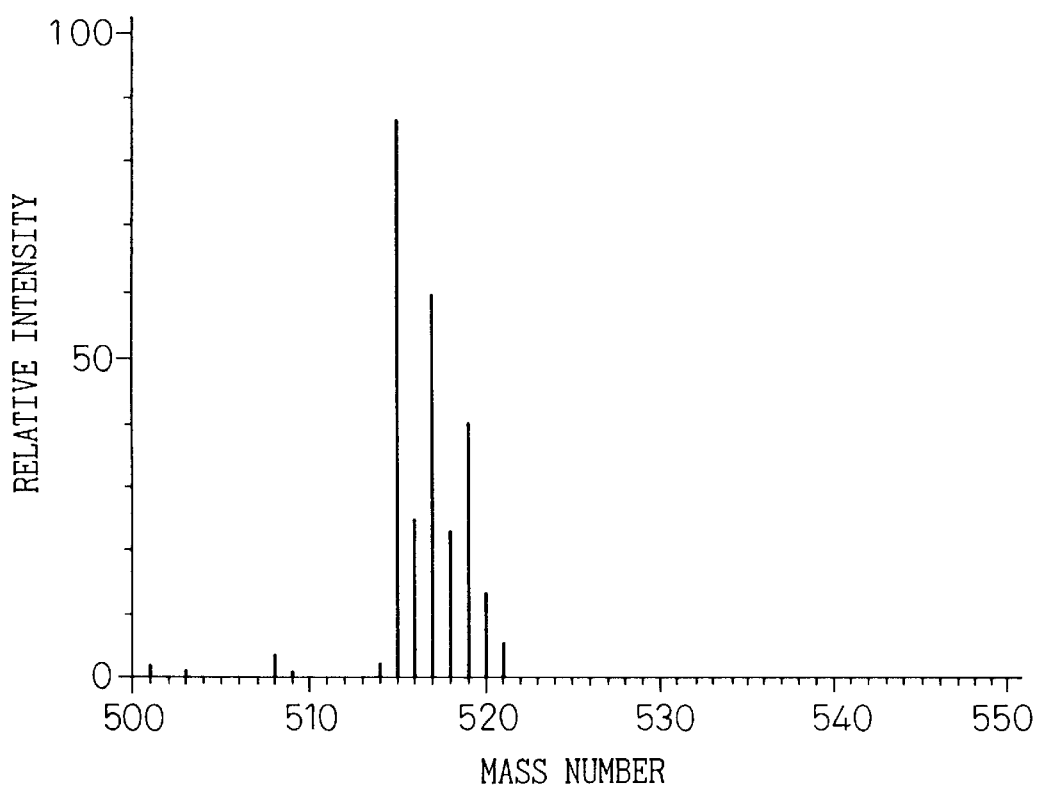
FIG. 2 is a mass spectrogram of 2-(O-hydroxyphenyl) benzothiazole zinc complex.

Moreover, upon measurement of the mass spectrum of the reaction product thus obtained, the mass spectrogram shown in FIG. 2 was obtained. A main peak near a mass number of 515 observed therein is a spectrum specific to the 2-(O-hydroxyphenyl)benzothiazole zinc complex.

(2) Preparation of EL device

A three layer type organic EL device 10 shown in FIG. 1 was prepared by forming in order, on a transparent anode 14 (indium-tin oxide) having a thickness of 100 nm and formed on a transparent glass plate 12, a hole injection layer 16 having a thickness of 75 nm and composed of a tetraphenyldiamine derivative, a luminescent layer 18 having a thickness of 75 nm and composed of quinolinol aluminum complex, an electron transporting layer 20 having a thickness of 75 nm and composed of the 2-(O-hydroxyphenyl) benzothiazole zinc complex synthesized in (1) and a cathode 10 having a thickness of 100 nm and composed of aluminum.

The hole transporting layer 16, the luminescent layer 18, the electron transporting layer 20 and the cathode 10 were each formed by vacuum deposition. In particular, the hole transporting layer 16, the luminescent layer 18 and the electron transporting layer 20 were formed by continuous deposition in a high vacuum of about $10^{-6}$ Torr without interrupting the vacuum state. Consequently, the hole transporting layer 16, the luminescent layer 18 and the electron transporting layer 20 each had the same area.

(3) Luminescent test

When a direct current or pulse voltage was applied from an electric source to the anode 14 and the cathode 10 of the three layer type organic EL device shown in FIG. 1, green light was emitted from the luminescent layer 18.

Figure 3:
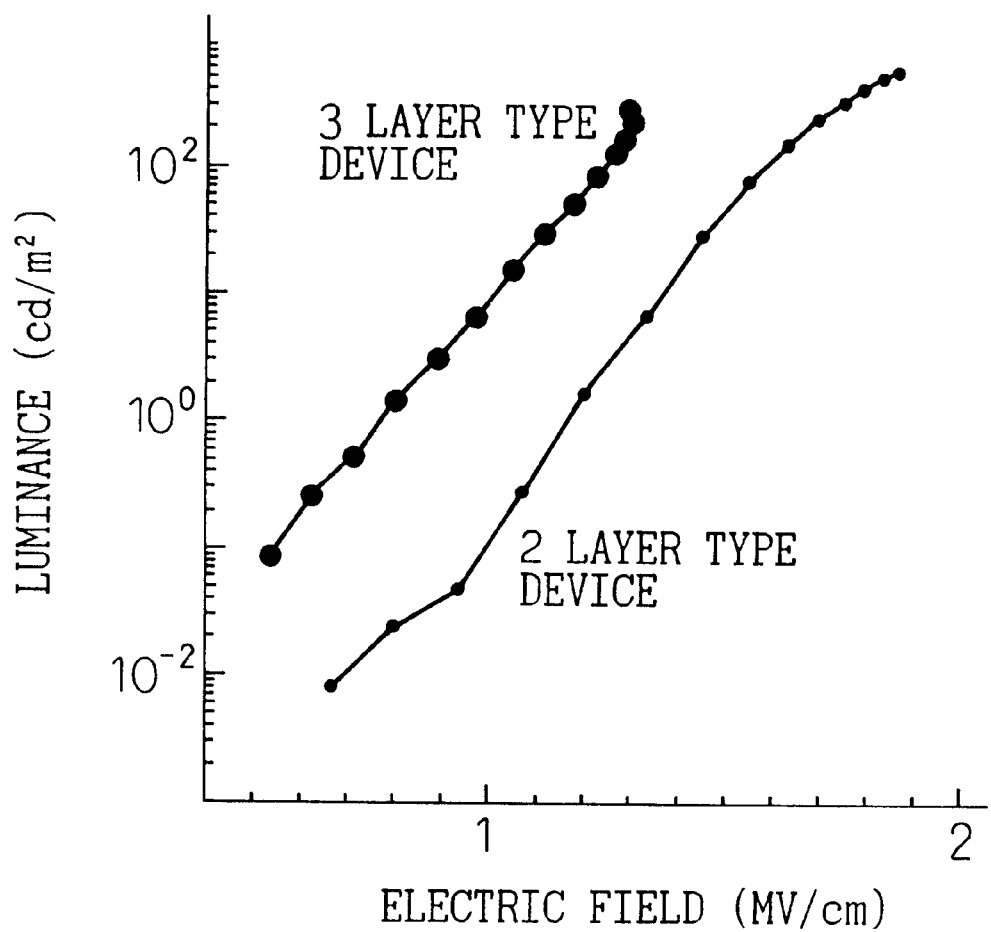
FIG. 3 is a graph illustrating the degree of luminance of the organic EL device of the present invention and that of a conventional organic EL device.

Furthermore, the voltage applied to the anode 14 and the cathode 10 was varied, and the intensity of the light emitted therefrom was measured. The results thus obtained are shown in FIG. 3.

Comparative Example

Figure 5:
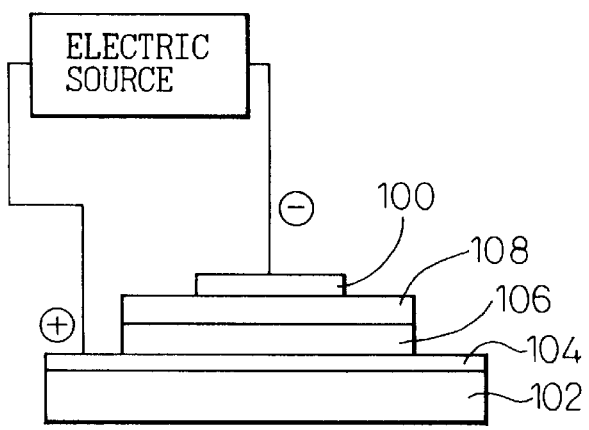
FIG. 5 is a drawing for explanation of a conventional organic EL device.

A two layer type organic EL device shown in FIG. 5 was prepared in the same manner as in Example 1 except that the electron transporting layer 20 was not provided.

The two layer type organic EL device was prepared by forming in order, on a transparent anode 104 (indium-tin oxide) having a thickness of 100 nm and formed on a transparent glass plate 102, a hole transporting layer 106 having a thickness of 100 nm and composed of a tetraphenyldiamine derivative, a luminescent layer 108 having a thickness of 100 nm and composed of quinolinol aluminum complex and a cathode 100 having a thickness of 100 nm and composed of a metal such as aluminum.

When a direct current or pulse voltage was applied from an electric source to the anode 104 and the cathode 100 of the two layer type organic EL device shown in FIG. 5, green light was emitted from the luminescent layer 108 in the same manner as in Example 1.

Furthermore, the voltage applied to the anode 104 and the cathode 100 was varied, and the intensity of the light emitted from the luminescent layer 108 was measured. The results thus obtained are also shown in FIG. 3.

It is evident from FIG. 3 that the three layer type organic EL device shown in FIG. 1 and comprising an electron transporting layer 20 composed of the 2-(O-hydroxyphenyl) benzothiazole zinc complex can emit light of high intensity compared with the two layer type organic EL device shown in FIG. 5 and not comprising an electron transporting layer 20.

Figure 4:
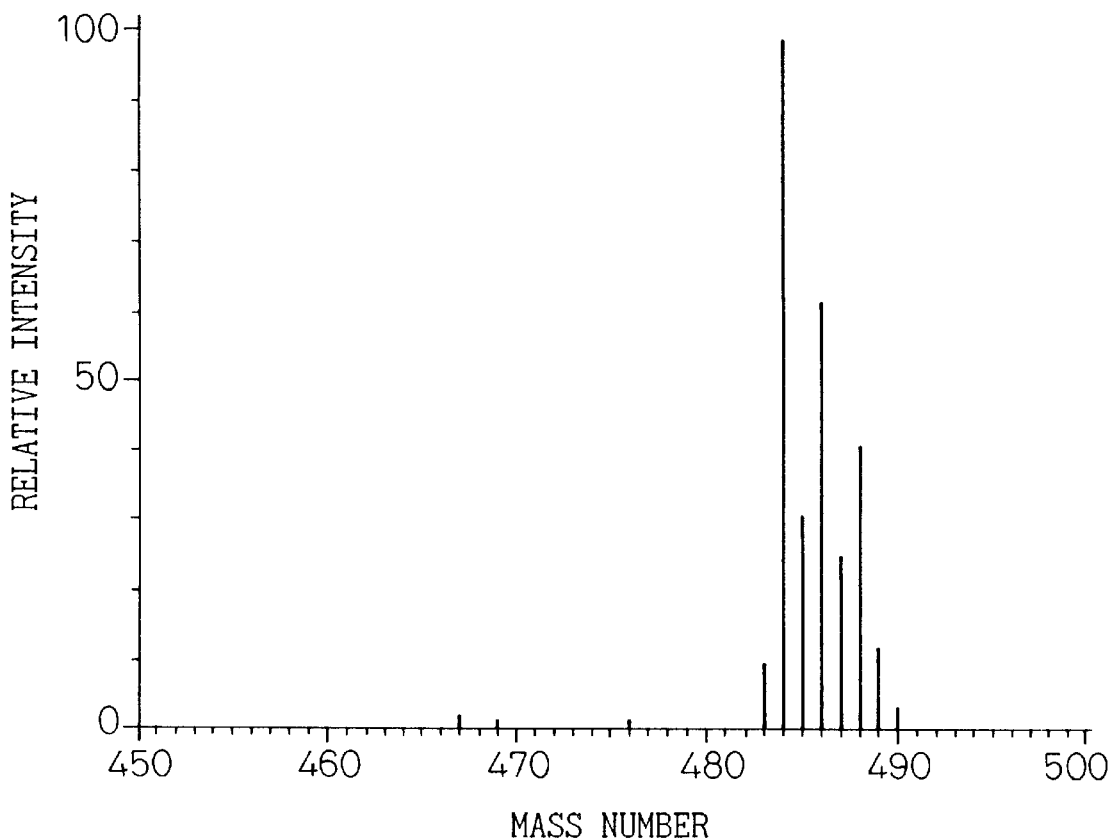
FIG. 4 is a mass spectrogram of 2-(O-hydroxyphenyl) benzoxazole zinc complex.

A three layer type organic EL device having between the cathode and the luminescent layer, an electron injection layer composed of 2-(O-hydroxyphenyl)benzoxazole zinc complex showing a main peak near a mass number 485 in a mass spectrogram shown in FIG. 4, in place of the electron transporting layer 20 composed of the 2-(O-hydroxyphenyl) benzothiazole zinc complex in Example 1 was prepared. The three layer type organic EL device thus prepared emitted light of high intensity compared with the two layer type organic EL device prepared in Comparative Example.

Since the three layer type organic EL device of the present invention can emit light of high intensity compared with the conventional two layer type organic EL device, it can be used for a display of an OA machine, and the like.

We claim:

1. An organic EL device which includes an organic luminescent layer comprising a quinolinol aluminum complex of the formula

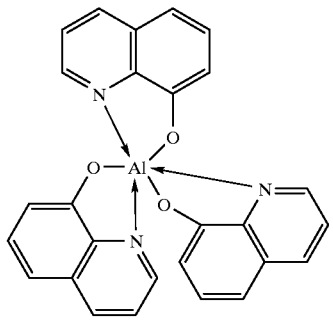

and a hole transporting layer between a cathode and an anode, wherein said organic EL device comprises between said cathode and said organic luminescent layer an electron transporting layer comprising a zinc complex of the formula

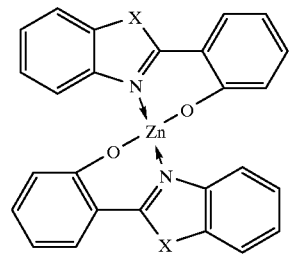

wherein X represents S or O.

2. The organic EL device according to claim 1, wherein said hole transporting layer comprises a tetraphenyldiamine derivative of the formula

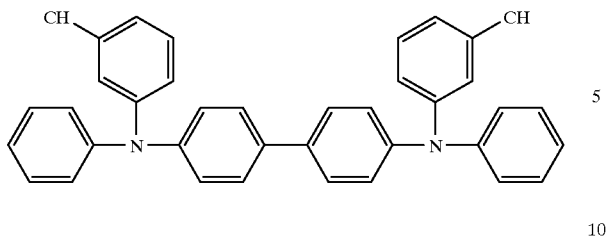

3. The organic EL device according to claim 2, wherein said hole transporting layer further comprises a pirazoline dimer or polyvinylcarbazole.

4. The organic EL device according to claim 1, wherein said cathode is composed of aluminum and the anode is transparent and is composed of an indium-tin oxide on a glass substrate.

5. An organic EL device which includes an organic luminescent layer comprising a quinolinol aluminum complex of the formula

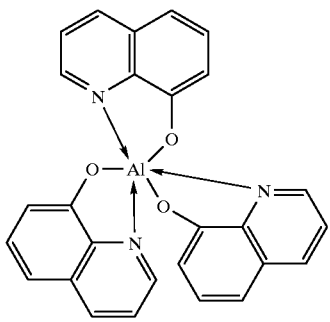

an electron transporting layer adjacent the organic luminescent layer and comprising a zinc complex of the formula

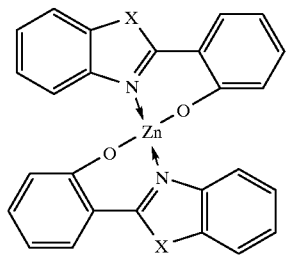

wherein X represents S or O, a cathode adjacent the electron transporting layer, a hole transporting layer adjacent the organic luminescent layer, and an anode adjacent the hole transporting layer.

6. The organic EL device according to claim 5, wherein said hole transporting layer comprises a tetraphenyldiamine derivative of the formula

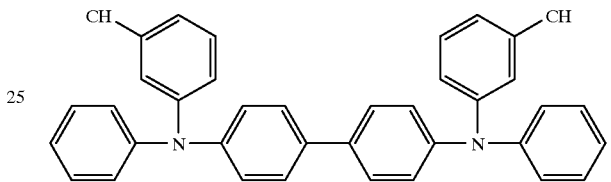

7. The organic EL device according to claim 5, wherein said hole transporting layer further comprises a pirazoline dimer or polyvinylcarbazole.

8. The organic EL device according to claim 5, wherein said cathode is composed of aluminum and the anode is transparent and is composed of an indium-tin oxide on a glass substrate.

* * * * *